(12) United States Patent
Fifield et al.

(10) Patent No.: US 10,224,710 B2
(45) Date of Patent: Mar. 5, 2019

(54) ELECTROSTATIC DISCHARGE POWER CLAMP WITH FAIL-SAFE DESIGN

(71) Applicant: INTERNATIONAL BUSINESS MACHINES CORPORATION, Armonk, NY (US)

(72) Inventors: John A. Fifield, Underhill, VT (US); Robert J. Gauthier, Jr., Hinesburg, VT (US); Junjun Li, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/815,473

(22) Filed: Nov. 16, 2017

(65) Prior Publication Data

US 2018/0097359 A1    Apr. 5, 2018

Related U.S. Application Data

(63) Continuation of application No. 14/577,145, filed on Dec. 19, 2014, now Pat. No. 9,882,376.

(51) Int. Cl.
| | |
|---|---|
| *H02H 9/00* | (2006.01) |
| *H02H 9/04* | (2006.01) |
| *H01L 23/522* | (2006.01) |
| *H01L 27/02* | (2006.01) |
| *H01L 29/94* | (2006.01) |

(52) U.S. Cl.
CPC ......... *H02H 9/046* (2013.01); *H01L 23/5228* (2013.01); *H01L 27/0285* (2013.01); *H01L 29/945* (2013.01); *H01L 2924/0002* (2013.01)

(58) Field of Classification Search
CPC .................................................... H02H 9/046
See application file for complete search history.

(56) References Cited

U.S. PATENT DOCUMENTS

| | | |
|---|---|---|
| 4,785,373 A | 11/1988 | Dash |
| 5,789,964 A | 8/1998 | Voldman |
| 6,646,840 B1 | 11/2003 | Sugerman et al. |

(Continued)

FOREIGN PATENT DOCUMENTS

| | | |
|---|---|---|
| CN | 103001200 A | 3/2013 |
| KR | 100942701 B1 | 2/2010 |

OTHER PUBLICATIONS

U.S. Non-Final Office Action for U.S. Appl. No. 14/577,145 dated Jun. 6, 2017.

(Continued)

*Primary Examiner* — Stephen W Jackson
(74) *Attorney, Agent, or Firm* — Sherman IP LLP; Kenneth L. Sherman; Steven Laut

(57) ABSTRACT

An electrostatic discharge protection circuit includes a power clamp device, a timing circuit including a first resistor, a first capacitor that is connected with the first resistor at a first node, and a second capacitor that is connected to a second node, a logic gate including a first input connected with the first node, a second input connected with the second node, and an output connected with the power clamp device, and a decoder device connected with a first address pin and a second address pin. The first address pin and the second address pin are used to detect the power clamp device switching on at time of power on and draining current.

20 Claims, 4 Drawing Sheets

(56) References Cited

U.S. PATENT DOCUMENTS

| | | |
|---|---|---|
| 6,690,555 B1 | 2/2004 | Pasqualini |
| 7,187,530 B2 | 3/2007 | Salling |
| 7,701,682 B2 | 4/2010 | Goyal et al. |
| 7,872,840 B1 | 1/2011 | Vashchenko et al. |
| 8,009,398 B2 | 8/2011 | Agarwal et al. |
| 8,238,067 B2 | 8/2012 | Drapkin et al. |
| 8,514,532 B2 | 8/2013 | Worley et al. |
| 8,669,828 B1 | 3/2014 | Wong et al. |
| 8,760,827 B2 | 3/2014 | Campi, Jr. et al. |
| 9,882,376 B2 * | 1/2018 | Fifield ................ H01L 27/0285 |
| 2005/0068702 A1 | 3/2005 | Connor et al. |
| 2009/0040671 A1 | 2/2009 | Zhang |
| 2014/0022678 A1 | 1/2014 | Maile et al. |
| 2014/0168831 A1 | 6/2014 | Watanabe |
| 2018/0097358 A1 | 4/2018 | Fifield et al. |

OTHER PUBLICATIONS

U.S. Notice of Allowance for U.S. Appl. No. 14/577,145 dated Sep. 18, 2017.
U.S. Non-Final Office Action for U.S. Appl. No. 15/815,464 dated Feb. 26, 2018.
List of IBM Patents or Patent Applications Treated as Related Form.

* cited by examiner

ELECTROSTATIC DISCHARGE POWER CLAMP WITH FAIL-SAFE DESIGN

BACKGROUND

An integrated circuit may be exposed to transient electrostatic discharge (ESD) events that can direct potentially large and damaging ESD currents to the integrated circuits of the chip. An ESD event involves an electrical discharge from a source, such as the human body or a metallic object, over a short duration and can deliver a large amount of current to the integrated circuit. An integrated circuit may be protected from ESD events by, for example, incorporating an ESD protection circuit into the chip. If an ESD event occurs, the ESD protection circuit triggers a power clamp device, such as a silicon-controlled rectifier, to enter a low-impedance, conductive state that directs the ESD current to ground and away from the integrated circuit. The ESD protection device holds the power clamp device in its conductive state until the ESD current is drained and the ESD voltage is discharged to an acceptable level.

Improved electrostatic discharge protection circuits that provide electrostatic discharge protection and methods of fabricating an electrostatic discharge protection circuit, as well as improved methods of protecting an integrated circuit from a transient electrostatic discharge event, are needed.

SUMMARY

In one embodiment, an electrostatic discharge protection circuit includes a power clamp device, a timing circuit including a first resistor, a first capacitor that is connected with the first resistor at a first node, and a second capacitor that is connected to a second node, a logic gate including a first input connected with the first node, a second input connected with the second node, and an output connected with the power clamp device, and a decoder device connected with a first address pin and a second address pin. The first address pin and the second address pin are used to detect the power clamp device switching on at time of power on and draining current.

BRIEF DESCRIPTION OF THE DRAWINGS

The accompanying drawings, which are incorporated in and constitute a part of this specification, illustrate various embodiments and, together with a general description of the embodiments given above and the detailed description of the embodiments given below, serve to explain the embodiments.

DETAILED DESCRIPTION

Figure 1:
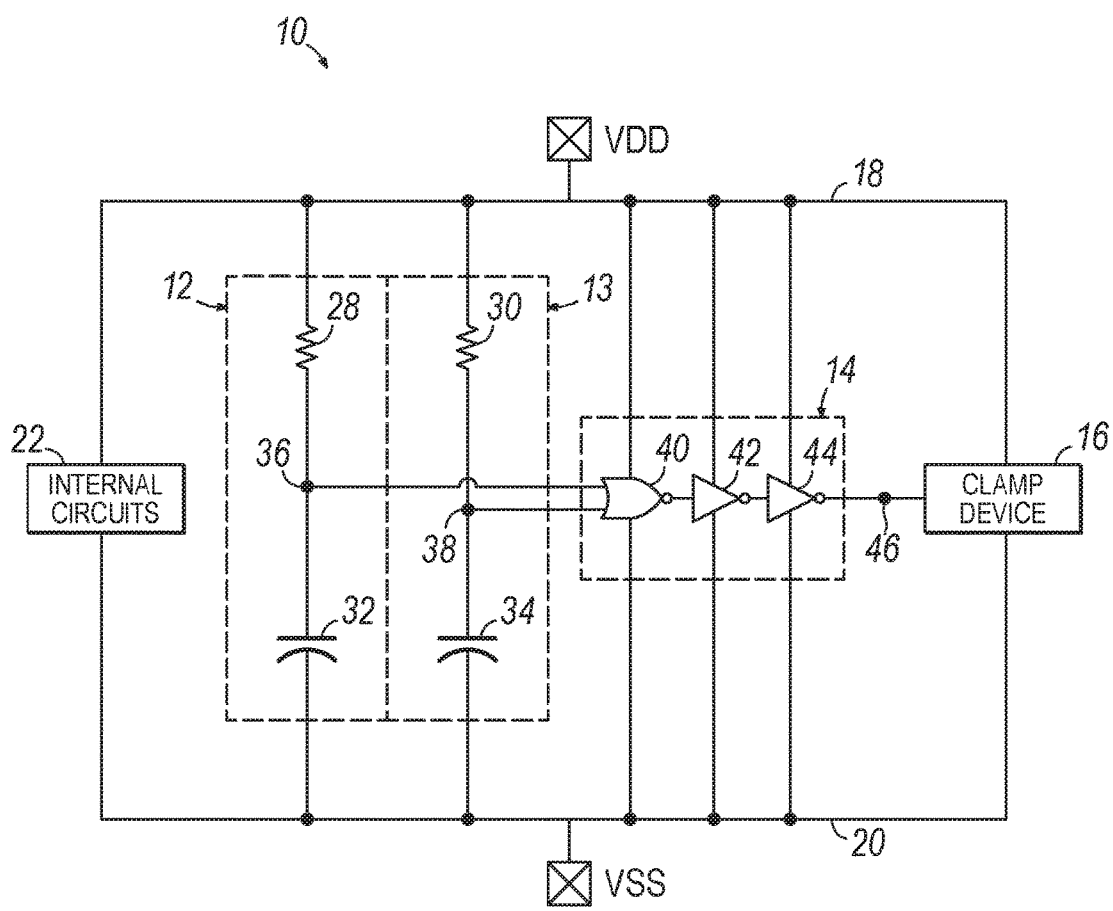
FIG. 1 is a circuit diagram for a timing circuit in accordance with an embodiment.
Figure 2:
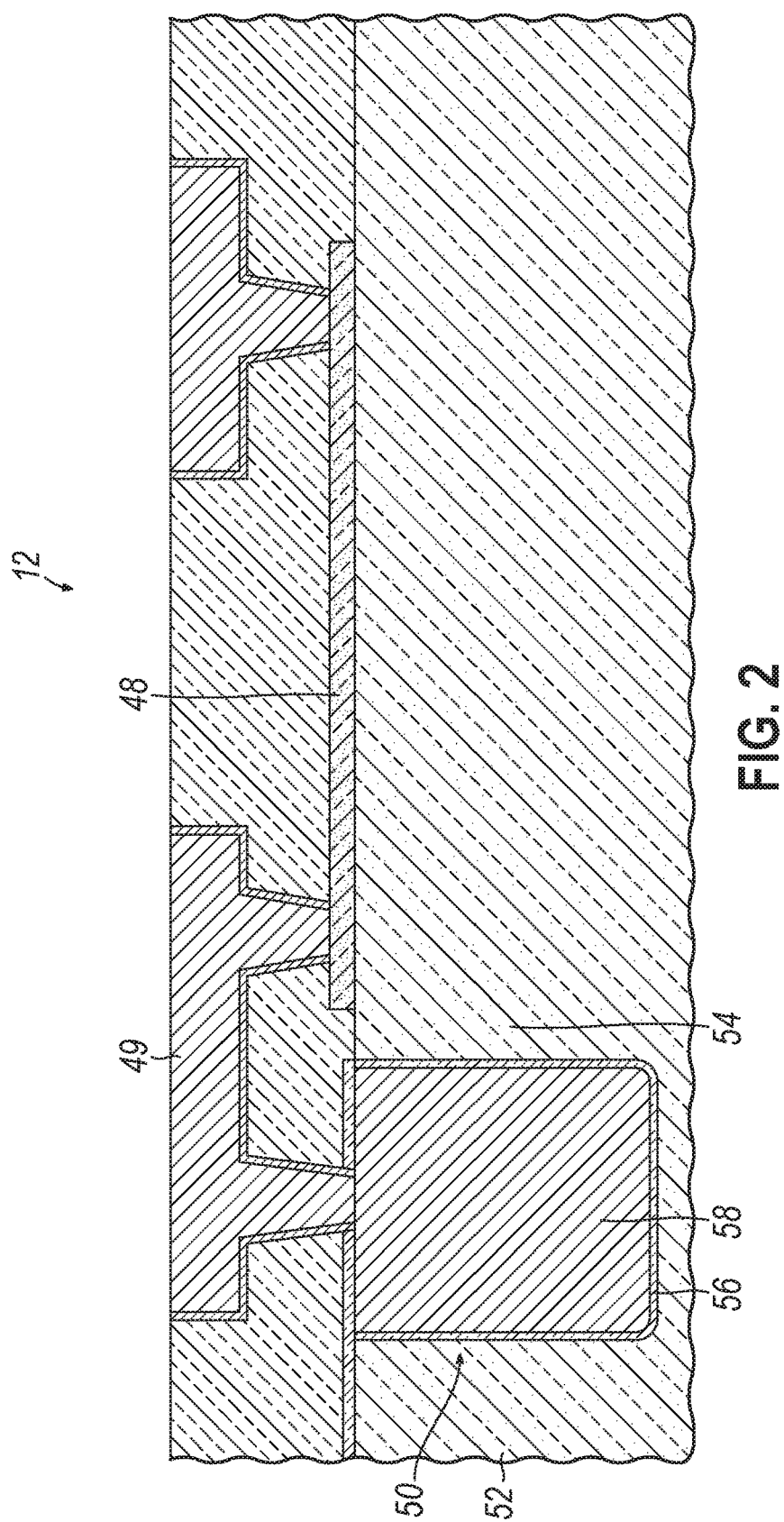
FIG. 2 is a cross-sectional view of a correlated pair comprising a resistor and a capacitor of the timing circuit.

With reference to FIGS. 1, 2 and in accordance with an embodiment, an electrostatic discharge (ESD) protection circuit 10 for a chip generally includes a plurality of timing circuits 12, 13 that are arranged in branches, a driving circuit 14, a NOR gate 40, and a power clamp device 16 coupled by the driving circuit 14 with the timing circuit 12. The timing circuits 12, 13 are coupled between a positive (VDD) rail 18 of a power supply and a negative (Vss) rail 20 of the power supply. The VDD rail 18 may be connected with a VDD power pin and the Vss rail 20 may be connected with a Vss power pin. Internal circuits 22 of a chip, which are protected by the ESD protection circuit 10 on the chip, are also connected with the VDD rail 18 and Vss rail 20. The timing circuits 12, 13, the driving circuit 14, the NOR gate 40, and the power clamp device 16 may be located on the chip.

The timing circuits 12, 13 are coupled in parallel between the VDD rail 18 and the Vss rail 20. The timing circuit 12 includes a resistor 28 and a capacitor 32 that are coupled in series between the VDD rail 18 and the Vss rail 20 with the resistor 28 coupled to the capacitor 32 at a node 36. The timing circuit 13 includes a resistor 30 and a capacitor 34 that are also coupled in series between the VDD rail 18 and the Vss rail 20 with the resistor 30 coupled to the capacitor 34 at a node 38. Additional timing circuits like timing circuits 12, 13 may be provided with correlated pairs of resistors and capacitors coupled in series between the VDD rail 18 and the Vss rail 20 to provide additional redundancy.

The driving circuit 14 of the ESD protection circuit 10 includes a NOR gate 40 and a plurality of inverters 42, 44 that couple the NOR gate 40 with the power clamp device 16. The NOR gate 40, which is comprised of p-channel transistors and/or n-channel transistors, includes a plurality of inputs that may be equal to the number of correlated pairs of resistors 28, 30 and capacitors 32, 34, which in turn is equal to the number of nodes 36, 38 and an output that is coupled with an input of the inverter 42. The NOR gate 40 is a digital logic gate that implements a logical NOR truth table with Boolean logic applied to input logic in order to generate output logic. If all of the inputs to the NOR gate 40 from the nodes 36, 38 are at a voltage equal to logic 1 (i.e., high or VDD), the voltage for the output logic signal is equal to logic O (i.e., low or Vss). If at least one of the inputs to the NOR gate 40 from the nodes 36, 38 is at a voltage equal to logic 1, the voltage for the output logic signal is equal to logic 0. If all of the inputs to the NOR gate 40 from the nodes 36, 38 are biased at a voltage equal to logic 0, the voltage for the logic signal output by the NOR gate 40 is equal to logic 1.

The inverter 44 has an input that is coupled with an output from the inverter 42 and an output that is coupled at a node 46 with the power clamp device 16. Each of the inverters 42, 44 is a digital logic gate that implements a logical negation truth table with Boolean logic applied to input logic in order to generate output logic. If the input to either of the inverters 42, 44 is equal to a voltage equal to logic 1 (i.e., high or VDD), the voltage for the respective output logic signal is equal to logic O (i.e., low or VSS). If the input to either of the inverters 42, 44 is equal to a voltage equal to logic 0, the voltage for the respective output logic signal is equal to logic 1.

Generally, the driving circuit 14 includes one or more inverters 42, 44 and features a two-stage configuration in the representative embodiment. However, the number of inverters 42, 44 may differ from the representative two-stage configuration in FIG. 1. For example, the number of inverters 42, 44 may comprise a four-stage configuration in order to output the correct logic in the representative embodiment. While the NOR gate 40 is indicated as part of the driving circuit 14, the NOR gate 40 may be considered to be distinct from the driving circuit in some embodiments.

When the chip is unpowered and in response to a transient ESD event, the power clamp device 16 may be triggered to switch from its high-impedance state to its low-impedance state by the operation of the timing circuits 12, 13 as orchestrated by the NOR gate 40. In its low-impedance state, the power clamp device 16 provides a current path to the Vss rail 20 with a current-carrying capacity that is sufficient to dissipate the large current produced by a transient ESD event at the VDD power pin or the Vss rail power pin.

The power clamp device 16 may be a metal-oxide-semiconductor transistor of large dimensions (e.g., a Big FET) having a gate with a width greater than one thousand microns that is coupled with the output from the driving circuit 14, and may be constructed as either a p-channel field-effect transistor or an n-channel field-effect transistor. In the representative embodiment, the power clamp device 16 is an n-channel field-effect transistor. In alternative embodiments, the power clamp device 16 may comprise a silicon controlled rectifier or a bipolar junction transistor.

The resistors 28, 30 of the timing circuit 12 each have a discrete resistance value and, in a representative embodiment, may be comprised of a polysilicon film resistor 48 (FIG. 2) that is formed by patterning a layer of polysilicon. The resistance of the polysilicon film resistor 48 is based on its dimensions and the resistivity of the polysilicon. In alternative embodiments, the resistors 28, 30 may comprise diffusion resistors, well resistors, etc.

The capacitors 32, 34 of the timing circuit 12 each have a discrete capacitance value. In the representative embodiment, each of the capacitors 32, 34 may be comprised of one or more deep trench capacitors 50. Each deep trench capacitor 50 includes capacitor plates (i.e., electrodes) and an intervening dielectric layer formed using a deep trench. In particular, each deep trench capacitor may have a construction as shown by the representative deep trench capacitor 50 shown in FIG. 2. Deep trench capacitor 50 is formed by patterning a substrate 52 with, for example, lithography, mask opening, and reactive ion etching to form a deep trench. After the deep trench is formed, a doped region 54 may be formed in the substrate by introducing a suitable p-type or n-type dopant using, for example, ion implantation. The doped region 54 supplies a common lower capacitor plate for the deep trench capacitor 50. A dielectric layer 56 (e.g., silicon dioxide, silicon oxynitride, silicon nitride, and/or hafnium oxide) is formed on the bottom and sidewall surfaces of the deep trench. The deep trench is filled with a low resistivity material (e.g., copper, tungsten, titanium nitride, and/or doped polysilicon) to supply an upper capacitor plate 58 of the deep trench capacitor 50. Deep trench capacitors 50, which may be fabricated in an array, are compact structures compared with other types of capacitor structures that may be used in ESD protection timing circuits. The deep capacitor 50 may be coupled with the resistor 48 by wiring 49 to define a node that represents one or the other of the nodes 36, 38.

In an embodiment, each of the capacitors 32, 34 may include only a single deep trench capacitor like deep trench capacitor 50. In another embodiment, each of the capacitors 32, 34 may include an array or a bank of deep trench capacitors like deep trench capacitor 50 that are wired together in parallel. In alternative embodiments, the capacitors 32, 34 may comprise metal-insulator-metal capacitors, metal-oxide-semiconductor capacitors, etc.

In the representative embodiment, the power clamp device 16, the NOR gate 40, and the inverters 42, 44 (as well as other devices described herein that are constructed from transistors) of the ESD protection circuit 10 may be comprised of n-channel or p-channel field-effect transistors that are fabricated by complementary metal-oxide-semiconductor (CMOS) processes. For example, each of the inverters 42, 44 includes a p-channel field-effect transistor and an n-channel field-effect transistor coupled in series with the p-channel field-effect between the VDD rail 18 and the Vss rail 20. Each of the field-effect transistors in the ESD protection circuit 10 may include a gate electrode, a gate dielectric layer positioned between the gate electrode and a semiconductor layer, and source/drain regions in the semiconductor layer. The conductor constituting the gate electrode may comprise, for example, metal, silicide, polycrystalline silicon (polysilicon), or any other appropriate material(s) deposited by a chemical vapor deposition process, etc. The gate dielectric may be comprised of a layer of a dielectric or insulating material such as silicon dioxide, silicon oxynitride, hafnium oxide, etc. The source/drain regions may be formed by selectively doping the semiconductor layer with ion implantation, dopant diffusion, etc. Middle-of-line and back-end-of-line (BEOL) processing ensues to provide an interconnect structure with wiring for power and signal transmission. In particular, the wiring of the interconnect structure may couple together the different device structures as diagrammatically shown in FIG. 1 (and other drawing views herein).

In use and with the chip unpowered, the ESD protection circuit 10 may respond to a transient ESD event that applies an ESD potential between the VDD rail 18 and the Vss rail 20. The response time of the ESD protection circuit 10 may be governed by the shorter of a time constant characterizing the timing circuit 12 and a different time constant characterizing the timing circuit 13. The time constant of timing circuit 12 is based on a product of the electrical resistance of resistor 28 and capacitor 32. The time constant of timing circuit 13 is based on a product of the electrical resistance of resistor 28 and capacitor 32, 34. In an embodiment, the electrical resistance of each of the resistors 28, 30 is equal and the capacitance of each of the capacitors 32, 34 is equal so that the timing circuits 12, 13 have equal time constants. Regardless of whether the capacitors 32, 34 are functional or non-functional, each of the timing circuits 12, 13 will output a voltage capable of triggering the power clamp device 16 in response to a transient ESD event at the VDD power pin or the Vss rail power pin. The NOR gate 40 will output a voltage equal to high because all of the inputs to the NOR gate 40 are low. The driving circuit 16 will subsequently transfer the voltage of VDD from the output of the NOR gate 40 to the node 46, which will switch on the power clamp device 16 to provide its low-impedance state. In its low-impedance state, the power clamp device 16 defines a low-impedance current path to ground at the Vss rail 20 such that the ESD current is safely diverted away from the internal circuits 22. After the current from the transient ESD event dissipates, the power clamp device 16 returns to its high-impedance state as the voltage at the node 46 is removed.

In use and when the chip is powered on using the power supply, the ESD protection circuit 10 provides fail-safe operation. If the capacitors 32, 34 are functional and non-defective, both of the inputs to the NOR gate 40 will be equal to logic 1 (i.e., high or VDD) when the chip is initially powered. The output from the NOR gate 40 will be equal to logic O (i.e., low or Vss), which is then applied as the corresponding voltage of Vss at the node 46 to the power clamp device 16. In the representative embodiment, the low voltage at the node 46 will maintain the power clamp device 16 in its high-impedance state that isolates the VDD rail 18 from the Vss rail 20 while the chip is powered by the power supply.

One or more of the capacitors 32, 34 may be fabricated in a defective condition or may become defective during use such that one or more of the capacitors 32, 34 exhibits an abnormally-low impedance (i.e., shorted to ground relative to the respective resistor). When the chip is not powered, a defective capacitor will have a minimal effect on the performance of the ESD protection circuit 10 as the branch of the timing circuit 12 containing the defective capacitor has an infinite time constant. The timing circuit 12 will continue to trigger the power clamp device 16 to furnish ESD protection for the unpowered chip.

When an attempt is made to initially power the chip, the ESD protection circuit 10 is configured to react to any of the capacitors 32, 34 being in a defective condition. In this situation, the ESD protection circuit 10 is configured to maintain the power clamp device 16 in its high-impedance state and to not allow the defective capacitor to cause the power clamp device 16 to be placed in its low-impedance state so that a large current is directed through the power clamp device 16 to ground. In an embodiment in which the power clamp device 16 is a Big FET with a gate length greater than or equal to one thousand microns, the unwanted large current that is averted by the ESD protection circuit 10 may amount to several amperes.

To permit the chip to be successfully powered on using the power supply, the ESD protection circuit 10 is configured to provide a fail-safe design that responds to one or the other of the capacitors 32, 34 being in a defective condition. Specifically, if at least one but fewer than all of the capacitors 32, 34 are in a defective condition, the NOR gate 40 causes a voltage equal to logic O (i.e., low or Vss) to be applied to the power clamp device 16 so that the power clamp device 16 is placed in its high-impedance state. The ESD protection circuit 10 prevents the node 46 feeding the power clamp device 16 from being pulled high due to the presence of a defective capacitor and, thereby, presents the VDD rail 18 from being directly shorted to the Vss rail 20 through the turned-on power clamp device 16.

As an example, if the voltage at node 36 is equal to logic O because of a defective capacitor 32 and the voltage at node 38 is equal to logic 1 because of a non-defective (i.e., functional) capacitor 34, the inputs to the NOR gate 40 will be equal to logic 1 and logic 0. The output from the NOR gate 40 will be equal to logic 0, which is then applied as the corresponding voltage of Vss at the node 46 to the power clamp device 16. While the chip is powered, the low voltage at the node 46 will be maintained and the power clamp device 16 will be maintained in its high-impedance state so the VDD rail 18 is electrically isolated from the Vss rail 20.

The NOR gate 40 outputs a voltage equal to logic 1 (i.e., high or VDD) only if all of the inputs to the NOR gate 40 from the nodes 36, 38 are equal to logic 0. This represents a condition in which all of the capacitors 32, 34 are defective. Increasing the number of timing circuits 12, 13 operates to decrease the probability that the NOR gate 40 will output a voltage equal to logic 1 when the chip is powered. As a result, the fail-safe nature of the design may be improved by increasing the number of timing circuits 12, 13 and the corresponding number of inputs to the NOR gate 40. If only one of the timing circuits 12, 13 contains a functional capacitor, then the ESD protection circuit 10 will permit the chip to be powered on. The redundancy present in the ESD protection circuit 10 allows a larger number of defective capacitors to be tolerated in comparison with conventional ESD protection circuits that lack such redundancy. Due to the redundancy in the timing circuits 12, 13, the chip carrying the ESD protection circuit 10 is less likely to be considered faulty during electrical testing and subsequently scrapped.

In an alternative embodiment in which the power clamp device 16 is a p-channel field-effect transistor, the number of inverters in the driving circuit 14 may be modified to provide the correct control logic in response to the output from the NOR gate 40.

Figure 3:
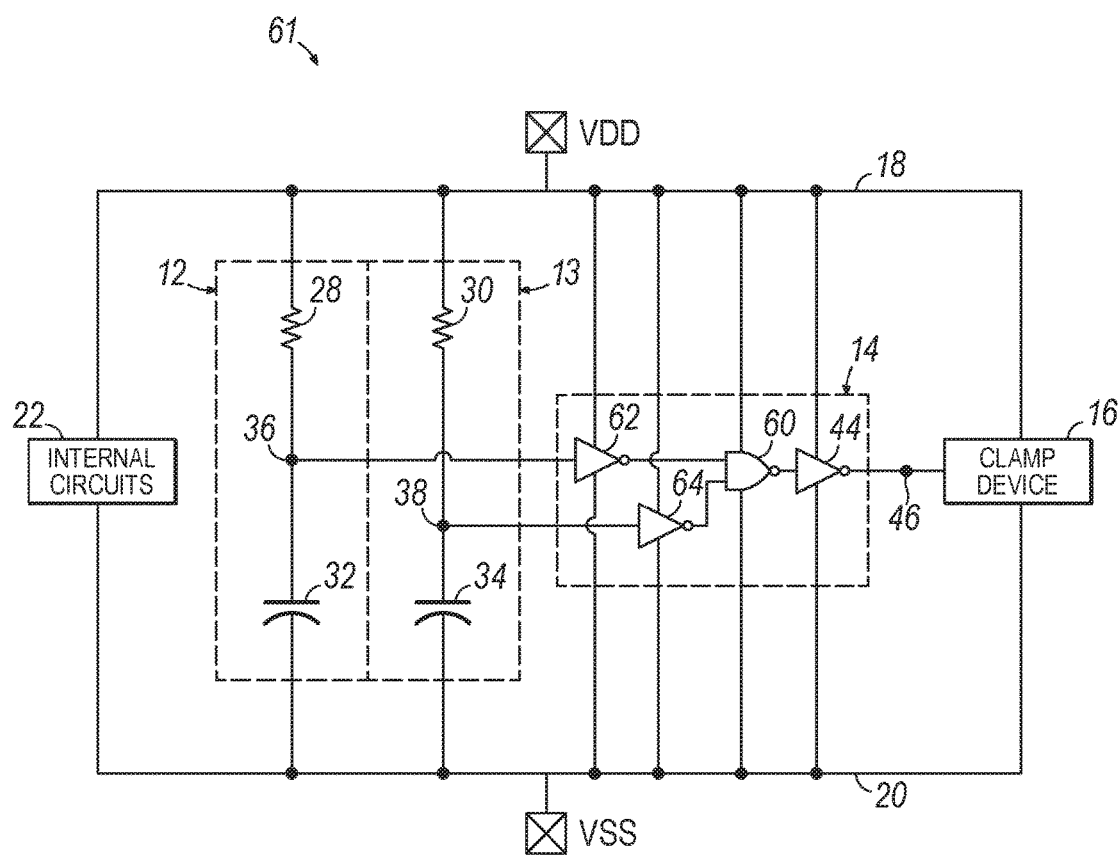
FIG. 3 is a circuit diagram for a timing circuit in accordance with an embodiment.

With reference to FIG. 3 in which like reference numerals refer to like features in FIG. 1 and in accordance with an alternative embodiment, the NOR gate 40 may be replaced in the ESD protection circuit 10 by a NAND gate 60 and a plurality of inverters 62, 64 in order to form an ESD protection circuit 61. In addition, the driving circuit 14 of the ESD protection circuit 61 only includes the inverter 44, which couples the output of the NAND gate 60 with the power clamp device 16. Generally, the driving circuit 14 includes one or more inverters 44 and features a one-stage configuration in the representative embodiment. However, the driving circuit 14 may include additional inverters to form, for example, a three-stage configuration.

The NAND gate 60 is a digital logic gate, which is comprised of transistors, that implements a logical conjunction truth table with Boolean logic applied to output a logic signal. The NAND gate 60 includes inputs that are coupled, respectively, by the inverters 62, 64 with the nodes 36, 38 of the timing circuit 12 and an output that is coupled with the input to inverter 44. If any or all of the inputs to the NAND gate 60 from the nodes 36, 38, as modified by the operation of the inverters 62, 64, supplies a voltage equal to logic O (i.e., low or Vss), the voltage for the output logic signal is equal to logic 1 (i.e., high or VDD)—The inverter 44 outputs a voltage representing the opposite logic level to the input received from the NAND gate 60. As a result, the inverter 44 outputs a voltage equal to logic O if the output received from the NAND gate 60 is equal to logic 1 so that the power clamp device 16 is placed in its high-impedance state, and the inverter 44 outputs a voltage equal to logic 1 if the output from the NAND gate 60 is equal to logic O so that the power clamp device 16 is placed in its low-impedance state.

The ESD protection circuit 61 functions similarly to ESD protection circuit 10 during a transient ESD event occurring at one or the other of the VDD power pin or the Vss rail power pin. The ESD protection circuit 61 will cause the power clamp device 16 to be placed in its low-impedance state to divert the ESD current away from the internal circuits 22.

The ESD protection circuit 61 also functions similarly to ESD protection circuit 10 when the chip is powered using the power supply. For example, if the capacitors 32, 34 are functional and the voltages at the node 36, 38 are both equal to logic 1, the input through inverter 62 to the NAND gate 60 will be equal to logic O and the input through inverter 62 to the NAND gate 60 will be equal to logic 0. The output from the NAND gate 60 will be equal to logic 1, which is then inverted by inverter 44 and applied as the corresponding voltage of Vss at the node 46 to the power clamp device 16. In the representative embodiment, the low voltage at the node 46 will maintain the power clamp device 16 in its high-impedance state that isolates the VDD rail 18 from the Vss rail 20 when the chip is powered by the power supply.

As another example, if the voltage at the node 36 is equal to logic O because of a defective capacitor 32 and the voltage at the node 38 is equal to logic 1 because of a non-defective (i.e., functional) capacitor 34, the input through inverter 62 to the NAND gate 60 will be equal to logic 1 and the input through inverter 64 to the NAND gate 60 will be equal to logic 0. The output from the NAND gate 60 will be equal to logic 1, which is then inverted to logic 0 by the inverter 44 and applied as the corresponding voltage of Vss at the node 46 to the power clamp device 16 so that the power clamp device 16 is maintained in its high-impedance state.

The voltage for the logic signal output by the NAND gate 60 is equal to logic 0 (and inverted by inverter 44 to logic 1) only if all of the inputs to the NAND gate 60 from the nodes 36, 38 are equal to logic 1. This condition exists if both of the capacitors 32, 34 are defective. As discussed above with respect to ESD protection circuit 61, increasing the number of timing circuits 12, 13 to increase the redundancy may increase the tolerance to defective capacitors and contributes to increasing the robustness of the fail-safe design.

In an alternative embodiment in which the power clamp device 16 is a p-channel field-effect transistor, the number of inverters in the driving circuit 14 may be modified to provide the correct control logic in response to the output from the NAND gate 60.

Figure 4:
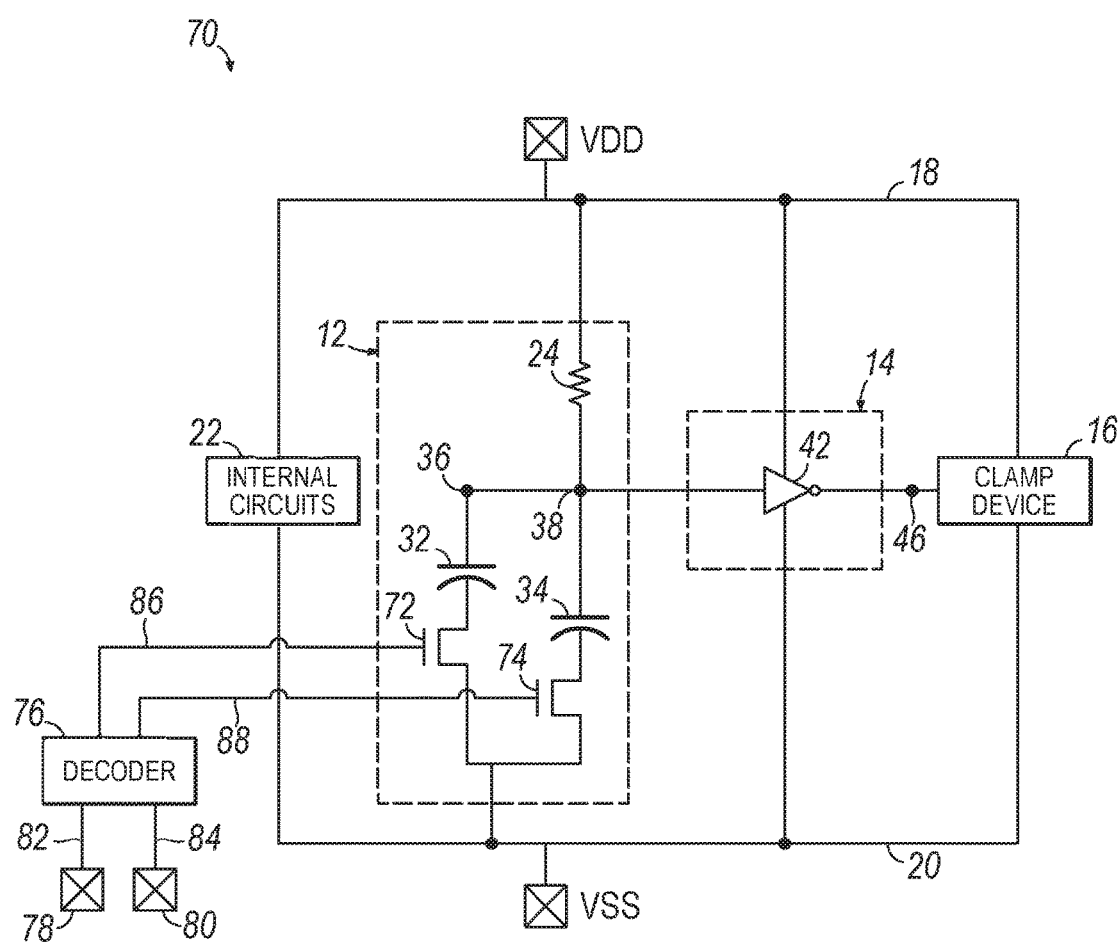
FIG. 4 is a circuit diagram for a timing circuit in accordance with an embodiment.

With reference to FIG. 4 in which like reference numerals refer to like features in FIG. 1 and in accordance with an alternative embodiment, an ESD protection circuit 70 includes the capacitors 32, 34 while the resistor 24 includes only a single resistor that is shared in common with the capacitors 32, 34 in the timing circuit 12. The ESD protection circuit 70 includes a plurality of field-effect transistors 72, 74 and a decoder 76 coupled in parallel with the gate of each of the field-effect transistors 72, 74. The source and drain of field-effect transistor 72 are coupled in series with capacitor 32 between the node 36 and the Vss rail 20. Similarly, the source and drain of field-effect transistor 74 are coupled in series with capacitor 34 between the node 38 and the Vss rail 20. When the chip is unpowered, the ESD protection circuit 70 operates as described hereinabove with respect to ESD protection circuit 10 to respond to a transient ESD event.

The decoder 76 is a digital logic device represented by a combinational circuit that converts binary information received from address pins 78, 80 on input lines 82, 84 to binary information output on output lines 86, 88. The number of input lines 82, 84 may differ from the number of output lines 86, 88. The decoder 76 may be comprised of a plurality of field-effect transistors wired to form one or more AND gates, one or more NAND gates, etc. and coupled to provide the desired binary information conversion.

When the chip is powered, the decoder 76 is addressable and programmable via address pins 78, 80 to provide voltages to the gates of the field-effect transistors 72, 74 for controlling the field-effect transistors 72, 74. Specifically, in response to the input of voltages conveying binary information via the input lines 82, 84 from the address pins 78, 80, the decoder 76 can output control logic at voltages over output lines 86, 88 that permit the transistors 72, 74 to be individually controlled and programmed. Normally and under a condition in which the capacitors 32, 34 are functional, the output of the decoder 76 biases the gates of the transistors 72, 74 so that all of the field-effect transistors 72, 74 are switched to a low-impedance state. As a result, each of the capacitors 32, 34 is individually coupled in a current path with the V88 rail 20 if the respective one of the field-effect transistors 72, 74 is placed by the operation of the decoder 76 in its low-impedance state. In one embodiment, the transistors 72, 74 may be NMOSFETs and the pins 78, 80 are set so that the decoder 76 biases the gates of the transistors 72, 74 with a voltage equal to logic 1 that places the transistors 72, 74 in their respective low-impedance states.

The ESD protection circuit 70 may be configured to detect the power clamp device 16 unexpectedly switching on at the time of power on and draining a large amount of current. This type of incident at chip power on may be the result of one or the other of the capacitors 32, 34 being defective and, as a consequence, appearing as a short to its respective resistor 28, 30. In response, the address pins 78, 80 of the ESD protection circuit 70 are used to investigate the incident and to pinpoint the capacitor that is the source of the short.

Specifically, the address pins 78, 80 are used to systematically turn on each of the transistors 72, 74 while turning off all other transistors with output voltages supplied through the output lines 86, 88. As each of the transistors 72, 74 is individually switched to its low-impedance state by the decoder 76 using the address pins 78, 80, the Vnn current is monitored for a large current flow indicative of a defective capacitor. In this manner, the defective capacitor can be identified and logged. After full testing, the decoder 76 is programmed to switch the transistors 72, 74 corresponding to defective capacitors to a voltage that disables such defective capacitors. If one or more of the capacitors 32, 34 are defective, the testing to provide the programmed state permits the chip to be successfully powered on without experiencing a short to ground through the defective capacitor. In an embodiment in which the transistors 72, 74 are n-channel field-effect transistors, the decoder 76 is programmed to output a voltage equal to logic 0 (i.e., low or Vss) to switch any of the transistors 72, 74 that are in series with a defective capacitor to their high-impedance state and any of the transistors 72, 74 that are in series with a functional capacitor to their low-impedance state.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrostatic discharge protection circuit comprising:
   a power clamp device;
   a timing circuit including a first resistor, a first capacitor that is coupled with the first resistor at a first node, and a second capacitor that is coupled to a second node;
   a logic gate including a first input coupled with the first node, a second input coupled with the second node, and an output coupled with the power clamp device; and a decoder device coupled with a first address pin and a second address pin, wherein the first address pin and the second address pin are used to detect the power clamp device switching on at time of power on and draining current.

2. The electrostatic discharge protection circuit of claim 1, wherein the first capacitor and the second capacitor each comprise at least one metal-insulator metal capacitor.

3. The electrostatic discharge protection circuit of claim 1, wherein the first capacitor and the second capacitor each comprise at least one metal-oxide semiconductor capacitor.

4. The electrostatic discharge protection circuit of claim 1, wherein the power clamp device switches on at the time of power on as a result of a defect of the first capacitor or the second capacitor.

5. The electrostatic discharge protection circuit of claim 1, wherein the first address pin and the second address pin are used to determine a failure at one of the first capacitor and the second capacitor.

6. The electrostatic discharge protection circuit of claim 1, wherein the first address pin and the second address pin are used to turn on each of a first transistor and a second transistor of the timing circuit.

7. The electrostatic discharge protection circuit of claim 6, wherein the decoder is programmable to switch the first transistor and the second transistor of the timing circuit to a voltage that disables one of the first capacitor and the second capacitor.

8. The electrostatic discharge protection circuit of claim 1, wherein the power clamp device is a junction transistor device.

9. The electrostatic discharge protection circuit of claim 1, wherein the power clamp device is a rectifier device.

10. A method of fabricating an electrostatic discharge protection circuit for a chip, the method comprising:
   forming, using a substrate, a first resistor, a first capacitor and a second capacitor of a timing circuit;
   forming, using the substrate, a power clamp device;
   forming, using the substrate, a logic gate including a first input coupled with a first node coupling the first capacitor with the first resistor, a second input coupled with a second node between the second capacitor and the first resistor, and an output coupled with the power clamp device; and
   forming, using the substrate, a decoder, the decoder including a first output line and a second output line.

11. The method of claim 10, wherein the first capacitor and the second capacitor each comprise at least one metal-insulator metal capacitor.

12. The method of claim 10, wherein the first capacitor and the second capacitor each comprise or at least one metal-oxide semiconductor capacitor.

13. The method of claim 10, wherein the first output line is coupled to a first transistor of the timing circuit, and the second output line is coupled to a second transistor of the timing circuit.

14. The method of claim 13, wherein the decoder is coupled to a first address pin and a second address pin, and the first pin and the second pin are used to detect the power clamp device switching on at time of power on and draining current.

15. The method of claim 14, wherein the first address pin and the second address pin are used to determine a failure at one of the first capacitor and the second capacitor, and the decoder is programmable to switch the first transistor and the second transistor of the timing circuit to a voltage that disables one of the first capacitor and the second capacitor.

16. A method of detecting a defective capacitor of an electrostatic discharge (ESD) protection circuit when power is applied to a chip and the electrostatic discharge protection circuit on the chip, the method comprising:
   using a first address pin and a second address pin of a decoder of the ESD protection circuit to switch a first transistor and a second transistor of a timing circuit of the ESD protection circuit to a low impedance state;
   monitoring $V_{nn}$ for a current flow indicative of a defective capacitor between a first capacitor and a second capacitor of the timing circuit; and
   programming the decoder to switch the first transistor and the second transistor corresponding to the defective capacitor to a voltage that disables the defective capacitor.

17. The method of claim 16, wherein the first capacitor and the second capacitor each comprise at least one metal-insulator metal capacitor or at least one metal-oxide semiconductor capacitor.

18. The method of claim 16, wherein the decoder the programming provides the chip to be powered on without experiencing a short to ground through the defective capacitor.

19. The method of claim 16, wherein the power clamp device is a rectifier device.

20. The method of claim 16, wherein the power clamp device is a junction transistor device.

* * * * *